(12) United States Patent
Chiang et al.

(10) Patent No.: US 7,888,704 B2
(45) Date of Patent: Feb. 15, 2011

(54) SEMICONDUCTOR DEVICE FOR ELECTROSTATIC DISCHARGE PROTECTION

(75) Inventors: Chiu-Chih Chiang, Hsinchu (TW); Han-Chung Tai, Kaohsiung (TW)

(73) Assignee: System General Corp. (TW)

(*) Notice: Subject to any disclaimer, the term of this patent is extended or adjusted under 35 U.S.C. 154(b) by 300 days.

(21) Appl. No.: 12/222,746

(22) Filed: Aug. 15, 2008

(65) Prior Publication Data
US 2010/0038677 A1 Feb. 18, 2010

(51) Int. Cl.
*H01L 29/74* (2006.01)
(52) U.S. Cl. .................. 257/173; 257/107
(58) Field of Classification Search .......... 257/107, 257/E29.181, 173
See application file for complete search history.

(56) References Cited

U.S. PATENT DOCUMENTS

| | | | |
|---|---|---|---|
| 4,400,711 A | 8/1983 | Avery | |
| 4,405,933 A * | 9/1983 | Avery | ................ 257/546 |
| 4,631,567 A | 12/1986 | Kokado et al. | |
| 4,692,781 A | 9/1987 | Rountree et al. | |
| 7,042,028 B1 | 5/2006 | Huang et al. | |
| 7,355,250 B2 | 4/2008 | Huang et al. | |
| 2005/0173727 A1* | 8/2005 | Manna et al. | ............ 257/173 |
| 2007/0018193 A1* | 1/2007 | Ker et al. | ................ 257/119 |

FOREIGN PATENT DOCUMENTS

CN 101207121 A 6/2008

* cited by examiner

*Primary Examiner*—Thao P. Le
(74) *Attorney, Agent, or Firm*—Bacon & Thomas, PLLC (57) ABSTRACT

A semiconductor device for electrostatic discharge protection is disclosed, and at least comprises a high-voltage parasite silicon controlled rectifier (HVSCR) and a diode. The HVSCR has an anode and a cathode, and the cathode of HVSCR is coupled to a ground. The diode, coupled to the HVSCR in series, also has an anode and a cathode. The anode of the diode is coupled to the anode of the HVSCR, and the cathode of the diode is coupled to a terminal applied with a positive voltage. The diode has a second conductivity type zone that could be constructed to form several strips or small blocks spaced apart from each other. Those small blocks could be any shapes and arranged regularly or randomly.

22 Claims, 8 Drawing Sheets

SEMICONDUCTOR DEVICE FOR ELECTROSTATIC DISCHARGE PROTECTION

BACKGROUND OF THE INVENTION

1. Field of the Invention

The invention relates in general to a semiconductor device for electrostatic discharge (ESD) protection, and more particularly to the ESD protection device for protecting the integrated circuits of electrical equipment operated at a high voltage.

2. Description of the Related Art

Generally, integrated circuits (ICs) are highly susceptible to damage from electrostatic discharge (ESD), such as high voltage transients in electrical equipment. In some electrical equipment, high voltage transients may have positive and/or negative peak levels ranged from of several hundred volts to several thousand volts (electrostatic voltages), and may have a duration of several microseconds. High voltage electrostatic discharge (ESD) transients can result from a user becoming electrostatically charged, for example, by friction or by induction and touching the terminals of an integrated circuit (ex. equipment controls) or the equipment housing of the circuit. Thus, the input transistor could be destroyed due to the inadvertent application of an electrostatic voltage.

Integrated circuits normally require electrostatic discharge (ESD) protection. One approach typically utilized in providing electrostatic discharge protection is to connect a parasite silicon controlled rectifier (SCR) to the gate of the input transistor. SCRs were applied frequently as an efficient electrostatic discharge protection clamp, and SCR protection structures have been disclosed the U.S. Pat. Nos. 4,400,711, 4,405,933, 4,631,567 and 4,692,781. The major advantage of these SCR protection structures is their high energy absorbing capability.

Figure 1:
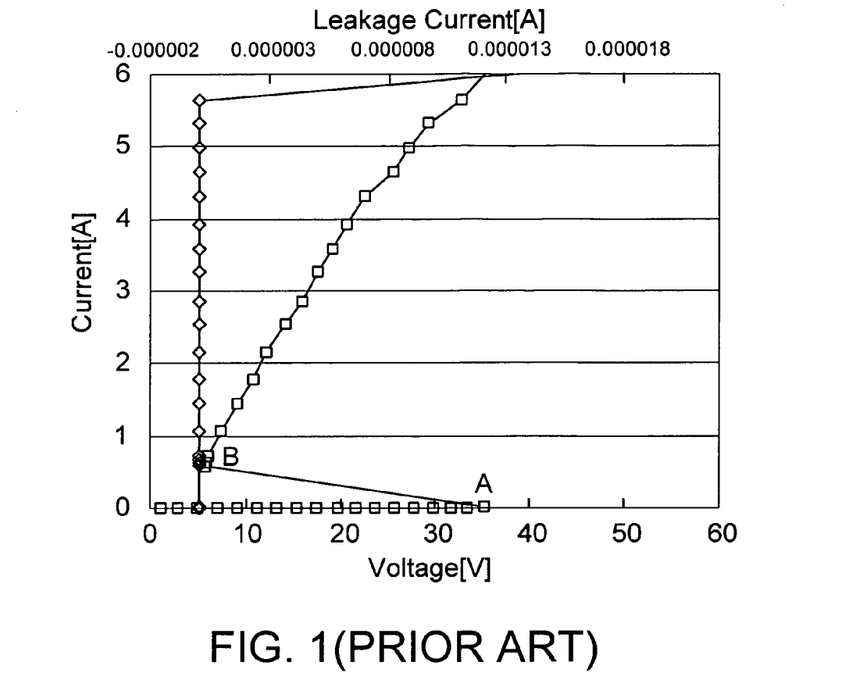
FIG. 1 shows a characteristic I-V curve of a HVSCR.

A high-voltage SCR (HVSCR) is required to protect the integrated circuits of electrical equipment operated at a high voltage (ex. about 30 volts or more) from damage. FIG. 1 shows a characteristic I-V curve of a HVSCR. In FIG. 1, point A represents a breakdown voltage, and point B represents a holding voltage. However, in some particular applications, it is desired to utilize an electrostatic discharge (ESD) protection device with higher breakdown voltage and holding voltage for being operated properly as a protection device.

SUMMARY OF THE INVENTION

It is therefore an object of the present invention to provide a semiconductor device for electrostatic discharge (ESD) protection, especially the device for protecting the integrated circuits of electrical equipment operated at a high voltage.

In one embodiment, the invention achieves the above-identified object by providing a semiconductor device for electrostatic discharge protection, and the device at least comprises a high-voltage parasite silicon controlled rectifier (HVSCR) and a diode. The HVSCR has an anode and a cathode, and the cathode of HVSCR is coupled to a ground. The diode, coupled to the HVSCR in series, also has an anode and a cathode. The anode of the diode is coupled to the anode of the HVSCR, and the cathode of the diode is coupled to a terminal applied with a positive voltage.

The invention achieves the above-identified object by providing another semiconductor device for electrostatic discharge protection, and the device comprises a parasitic silicon controlled rectifier (SCR) and a diode formed in a substrate of second conductivity type, and the diode is coupled to the SCR in series. The SCR at least comprises a plurality of first and second conductivity type doping regions alternatively and contiguously formed within a first well of first conductivity type; and a second conductivity type doping region connected to a ground being disposed between two first conductivity type doping regions, and three doping regions spaced from the first well and formed in a substrate of second conductivity type. The diode comprises a second conductivity type zone and a first conductivity type doping region, wherein the second conductivity type zone is formed within a second well of first conductivity type, and coupled to one of the first conductivity type doping regions in the first well. Also, the first conductivity type doping region of the diode is formed within the second well of first conductivity type and spaced apart from the second conductivity type zone, wherein the first conductivity type doping region is connected to a terminal applied with a positive voltage. The first and second conductivity types could be N-type and P type in the embodiments.

Further, in the embodiments, the second conductivity type zones of the diodes could be constructed to form several strips or small blocks spaced apart from each other. Those small blocks could be any shapes and arranged regularly or randomly.

Other objects, features, and advantages of the present invention will become apparent from the following detailed description of the preferred but non-limiting embodiment. The following description is made with reference to the accompanying drawings.

DETAILED DESCRIPTION OF THE INVENTION

Figure 2:
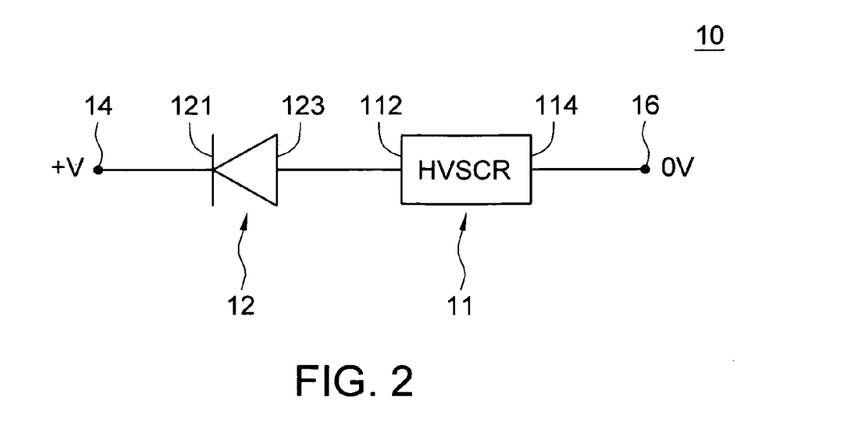
FIG. 2 is a diagram showing a semiconductor device for electrostatic discharge (ESD) protection of the present invention.

In the present invention, a semiconductor device for electrostatic discharge (ESD) protection, suitable for application on protecting the integrated circuits of electrical equipment operated at high voltage, is provided. FIG. 2 is a diagram showing a semiconductor device for electrostatic discharge (ESD) protection of the present invention. The semiconductor device 10 for ESD protection at least comprises a high-voltage parasite silicon controlled rectifier (HVSCR) 11 and a diode 12. The cathode 121 of the diode 12 is coupled to a terminal 14 applied with high voltage, and the anode 123 of the diode 12 is coupled to the anode 112 of the HVSCR 11. The cathode 114 of the HVSCR 11 is coupled to a ground terminal 16 applied with zero voltage. Compared to the ESD device using the sole HVSCR for protection, the breakdown voltage and holding voltage of the semiconductor device 10 (i.e. HVSCR+Diode) according to the present invention are significantly increased, and the semiconductor device 10 operates properly as a protection device for an electrical equipment operated at a high voltage (for example, over 30 volts).

In the present invention, two major embodiments are provided for demonstrating the semiconductor device for ESD protection. The embodiments illustrate the electrical connection between the diode and the HVSCR. Also, the embodiments illustrate different applicable designs for diode structures of the present invention. However, those embodiments disclosed herein are used for illustrating the invention, but not for limiting the scope of the invention.

Moreover, the basic techniques, such as formation of P well, P region, N well, N region, deep N well and N-type buried layer etc., are known by one skilled in the field of the invention and won't be illustrated in detail. Also, it is known for people skill in the art that the HVSCR structure presented in the embodiments and drawings could be slightly modified under the spirit of the invention. Thus, the specification and the drawings are to be regard as an illustrative sense rather than a restrictive sense. Additionally, the drawings used for illustrating the embodiments and applications of the present invention only show the major characteristic parts in order to avoid obscuring the present invention.

First Embodiment

Figure 3A:
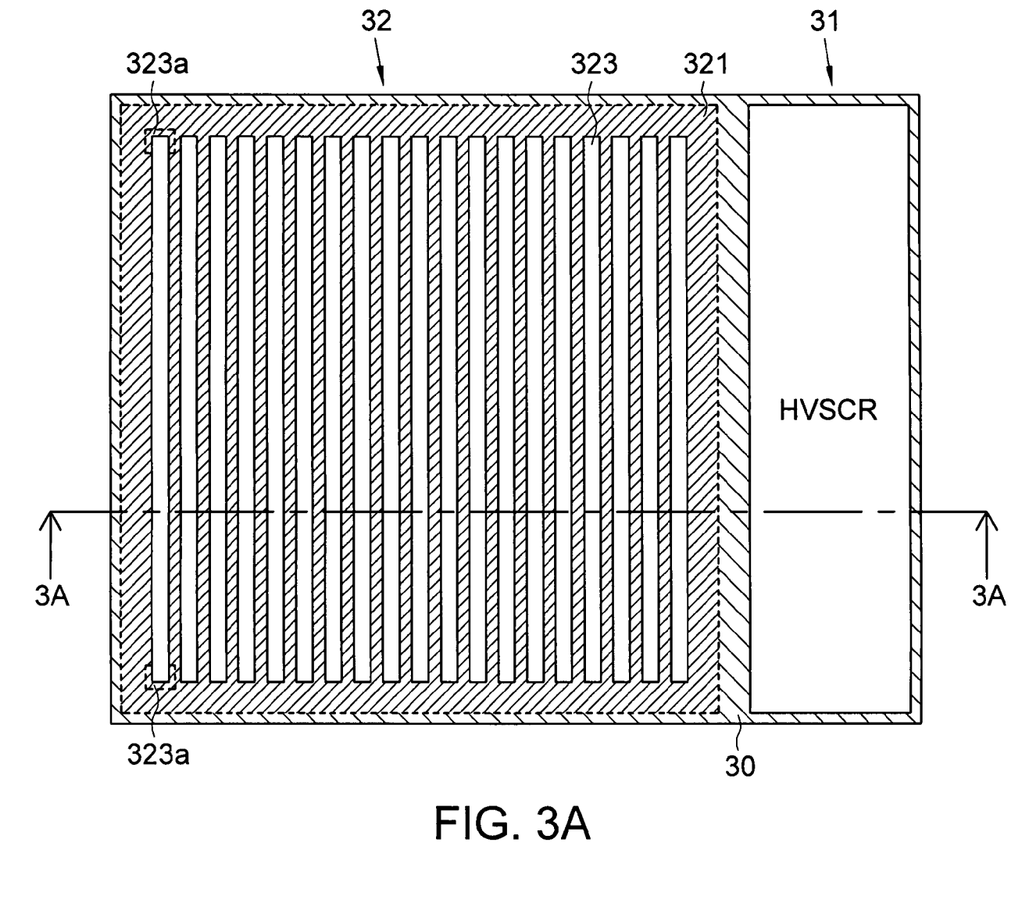
FIG. 3A schematically shows a top view of a semiconductor device for electrostatic discharge (ESD) protection according to the first embodiment of the present invention.
Figure 3B:
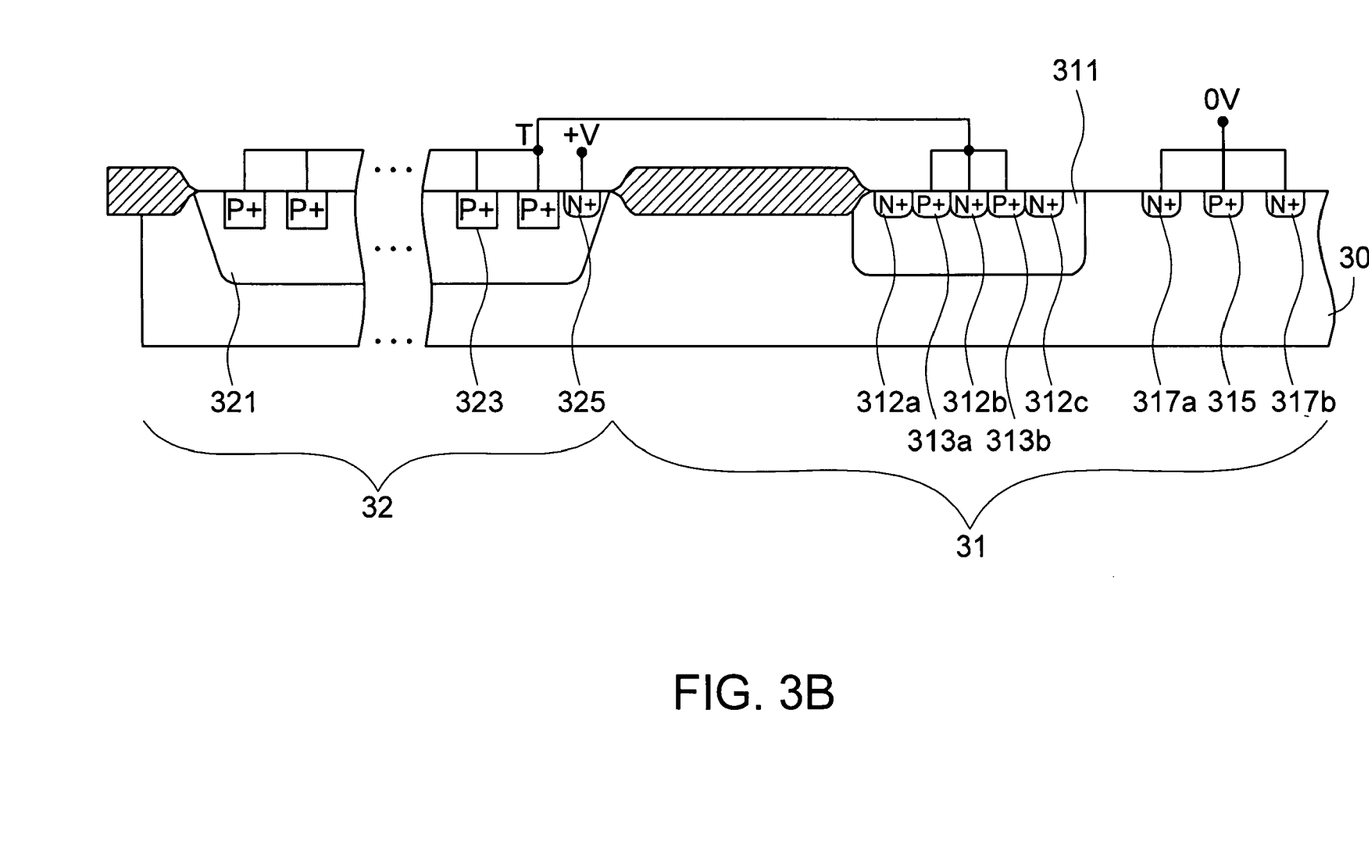
FIG. 3B is a cross-sectional view of the semiconductor device of FIG. 3B taken along the cross-sectional line 3A-3A.

FIG. 3A schematically shows a top view of a semiconductor device for electrostatic discharge (ESD) protection according to the first embodiment of the present invention. FIG. 3B is a cross-sectional view of the semiconductor device of FIG. 3B taken along the cross-sectional line 3A-3A.

As shown in FIG. 3A, the HVSCR 31 is coupled to the diode 32. Typically, a diode comprises a P+ zone formed within a N+ well, and the junction breakdown occurs at the interface between the P+ zone and the N+ well. Also, a junction breakdown first occurs at the edges of the interface between the P+ zone and the N+ well (due to the "Point Discharge Effect"). Accordingly, for increasing the numbers of edges, the P+ zone of the diode 32 in the first embodiment of the present invention is designed as several P+ strips 323, and those P+ strips are spaced apart and substantially formed in parallel. For each P+ strip 323, the junction breakdowns first occur at the edges close to the areas 323a, which the areas 323a surround two ends of the P+ strip 323.

FIG. 3B is a cross-sectional view of the semiconductor device of FIG. 3B taken along the cross-sectional line 3A-3A. As shown in FIG. 3B, the semiconductor device for ESD protection at least comprises a high-voltage silicon controlled rectifier (HVSCR) 31 and a diode 32 formed in a substrate 30.

The HVSCR 31 at least includes several first conductivity type doping regions (312a/312b/312c) and second conductivity type doping regions (313a/313b) alternatively and contiguously formed within a first well 311 of first conductivity type. Also, the second conductivity type doping regions (313a/313b) within the first well 311 of HVSCR are coupled to each other. The HVSCR 31 further includes a second conductivity type doping region 315 connected to a ground and two first conductivity type doping regions (317a/317b), wherein the second conductivity type doping region 315 is disposed between the doping regions 317a and 317b, and the doping regions 317a and 317b of HVSCR spaced from the first well 311 are coupled to each other. Also, three doping regions, 315, 317a and 317b, formed in the substrate 30 of second conductivity type are spaced from and outside the first well 311.

In the present embodiment, the first and second conductivity types are N type and P type, respectively. Therefore, the first well 311 is a N-well, the doping regions 312a, 312b, 312c, 317a and 317b are N+ regions, and the doping regions 313a, 313b and 315 are P+ regions accordingly. Also, the substrate 30 of the embodiment is made of the second conductivity type, i.e. P type (P-substrate, hereinafter).

The diode 32 is formed in the P-substrate 30 and coupled to the HVSCR 31 in series. The diode 32 has a second conductivity type zone (ex. P type) formed within a second well 321 of first conductivity type (ex. N type), and the second conductivity type zone is coupled to one of the first conductivity type doping regions (312a/312b/312c) in the first well 311. According to the first embodiment, the second conductivity type zone of the diode 32 comprises several P+ strips 323 to create more junction breakdown edges, and those P+ strips 323 are formed discretely. Also, each P+ strip 323 is electrically connected to a terminal T, and the terminal T is coupled to the first conductivity type doping region 312b in the first well 311.

Figure 4:
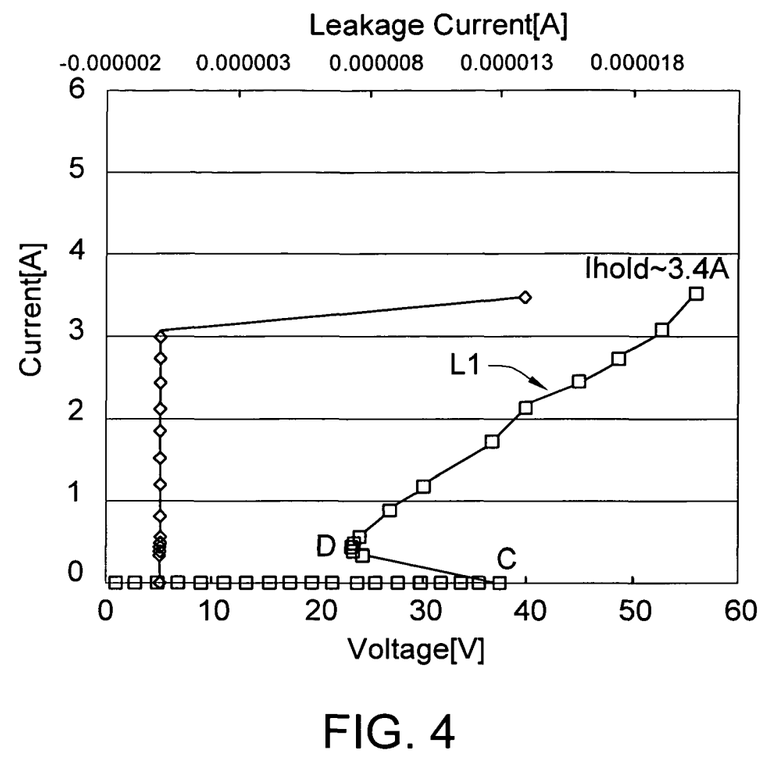
FIG. 4 shows a characteristic curve of a semiconductor device for ESD protection according to the first embodiment of the invention, which the device comprises a HVSCR and a diode, and the diode comprises several P+ strips.

FIG. 4 shows a characteristic curve of a semiconductor device for ESD protection according to the first embodiment of the invention, which the device comprises a HVSCR and a diode, and the diode comprises several P+ strips. In FIG. 4, point C represents a breakdown voltage, and point D represents a holding voltage. Also, the holding current of the semiconductor device is determined according to the slope of line L1. Compared to the ESD device using the sole HVSCR for protection, the breakdown voltage and holding voltage of the semiconductor device (i.e. HVSCR+Diode) of the second embodiment are increased, so that the device is suitable for being operated as a protection device for an electrical equipment operated at a high voltage.

Second Embodiment

Figure 5:
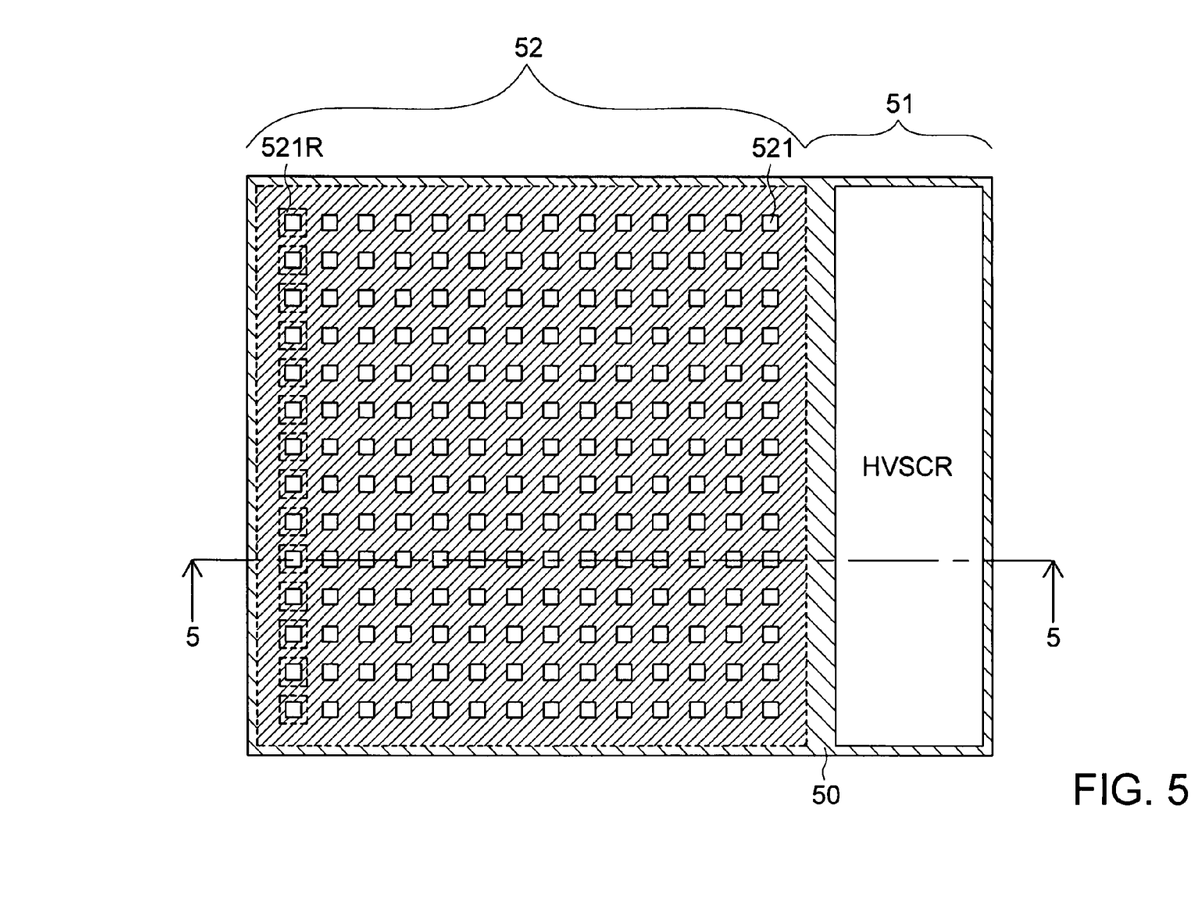
FIG. 5 schematically shows a top view of a semiconductor device for electrostatic discharge (ESD) protection according to the second embodiment of the present invention.

FIG. 5 schematically shows a top view of a semiconductor device for electrostatic discharge (ESD) protection according to the second embodiment of the present invention. The cross-sectional view of the semiconductor device of FIG. 5 taken along the cross-sectional line 5-5 is identical to FIG. 3B. It is noted that the semiconductor device of the second embodiment is similar to that of the first embodiment. Please also refer to FIG. 3B and related paragraphs for detail description of the device structure. The structural difference between the devices of the first and second embodiments is the design of the second conductivity type zones of the diodes.

In the first embodiment, the second conductivity type zone of the diode 32 is constructed to form several strips such as P+ strips 323, as shown in FIG. 3A. In the second embodiment, the second conductivity type zone of the diode 52 could be alternatively constructed to form a plurality of small blocks (ex. the blocks 521 with square cross-sections) spaced apart from each other, wherein the small blocks are coupled together to one of the first conductivity type doping regions in the first well (ex. the region 312b in the first well 311). In the second embodiment, those small blocks could be any shapes and arranged regularly or randomly. It is, of course, understood that the shapes and arrangement could be modified, depending on the requirements of the practical applications and process capability.

As shown in FIG. 5, each of the small blocks 521 (P+ blocks) has a rectangular cross-section, and substantially a square cross-section. Also, the small blocks 521 are arranged as a matrix.

According to the second embodiment, the second conductivity type zone of the diode 52 comprises several small blocks 521 to create more junction breakdown edges.

Accordingly, for increasing the numbers of edges, the P+ zone of the diode 52 in the second embodiment of the present invention is designed as a plurality of P+ small blocks 521, and these P+ small blocks 521 are spaced apart from each other, the junction breakdowns first occur at the edges close to the area 521R, which the area 521R surrounds four sides of the P+ small blocks 521. Compared to the P+ strips design (FIG. 3A), the P+ small blocks 521 has enormously increased the junction breakdown areas, so as to decrease the resistance of diode consequently. It is desirable to design a semiconductor device for ESD protection to have a low resistance.

Figure 6:
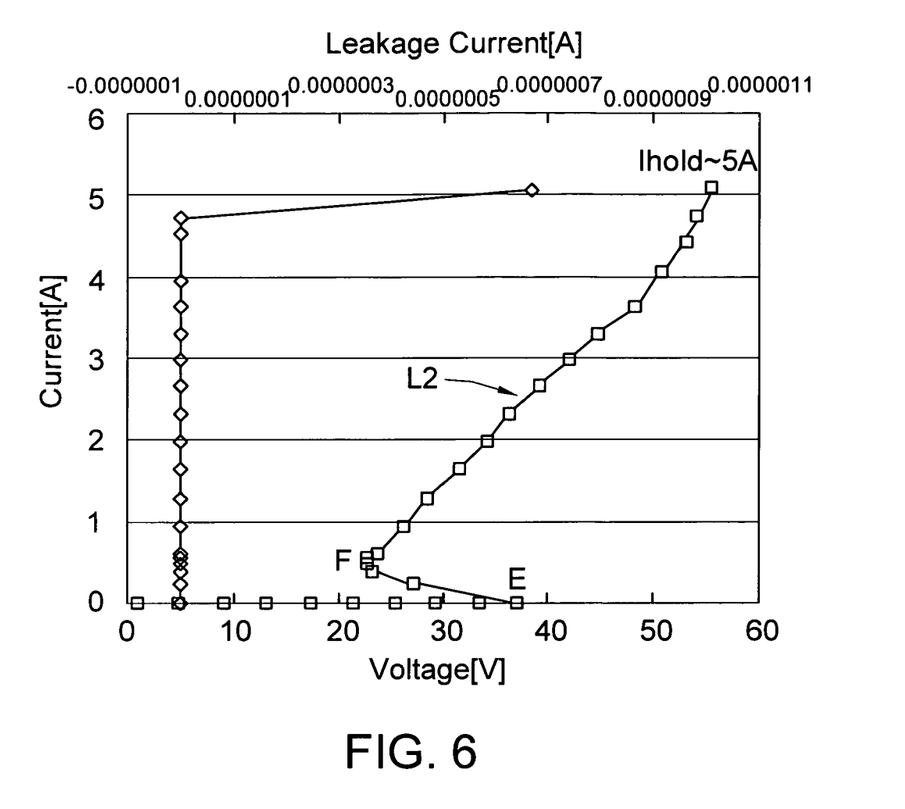
FIG. 6 shows a characteristic curve of a semiconductor device of FIG. 5 for ESD protection according to the second embodiment of the invention, which the device comprises a HVSCR and a diode, and the diode comprises several P+ small blocks with square cross-sections.

FIG. 6 shows a characteristic curve of a semiconductor device of FIG. 5 for ESD protection according to the second embodiment of the invention, which the device comprises a HVSCR and a diode, and the diode comprises several P+ small blocks with square cross-sections. In FIG. 6, point E represents a breakdown voltage, and point F represents a holding voltage. Also, the holding current of the semiconductor device is determined according to the slope of line L2. The slope of line L2 represents a sum of resistances of diode and HVSCR.

Please refer to FIG. 4 and FIG. 6. Compared to the ESD device of the first embodiment (P+ strips 323 of the diode 32), the breakdown voltage and the holding voltage of the ESD device of the second embodiment (P+ small blocks 521 of the diode 52) are remained at high values, so that the device of the second embodiment is suitable for being operated as a protection device for an electrical equipment operated at a high voltage. However, the slope of line L2 is larger than that of Line L1, because the device of the second embodiment possesses larger junction breakdown areas (i.e. more edges close to the area 521R being created) and the resistance of diode is consequently decreased. Therefore, the holding current of the semiconductor device according to the second embodiment is higher than the holding current of the semiconductor device according to the first embodiment. It is desirable to design a semiconductor device for ESD protection to have a high holding current which exceeds the internal/external current source capability.

Other shapes and arrangements of the P+ small blocks applicable for being the second conductivity type zone of the diode 52 are demonstrated in FIG. 7-FIG. 10. However, the present invention is not limited herein. It is known that the people skilled in the art could be likely to change the shape or arrangement of the small blocks by the disclosure of the present invention.

Figure 7:
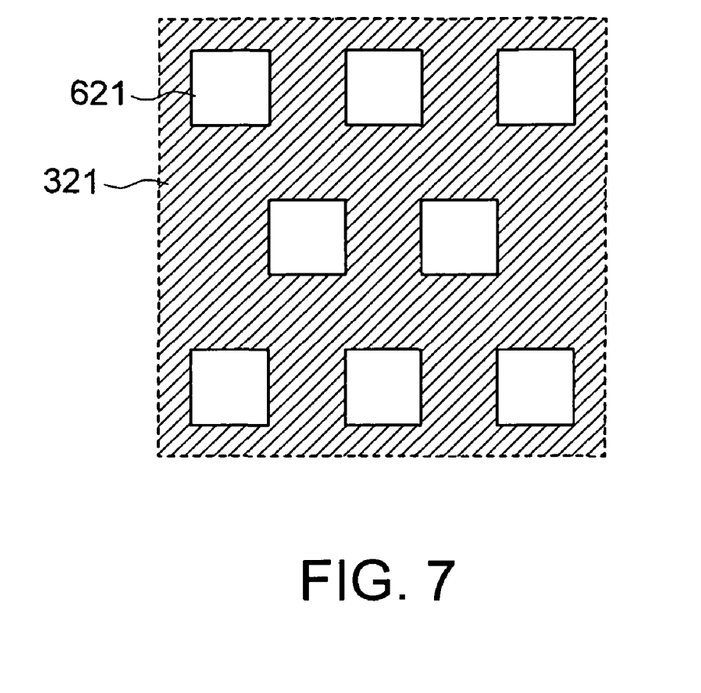
FIG. 7 schematically shows a top view of another semiconductor device for electrostatic discharge (ESD) protection according to the second embodiment of the present invention.

FIG. 7 schematically shows a top view of another semiconductor device for electrostatic discharge (ESD) protection according to the second embodiment of the present invention. As shown in FIG. 7, the diode comprises several second conductivity type (such as P+) small blocks 621 (i.e. formed within the second well 321) with substantially square cross-sections, and the small blocks 621 are arranged to form a plurality of columns in parallel. Also, the P+ small blocks 621 of each column/row are apart from each other, and the P+ small blocks 621 of adjacent columns/rows are apart from each other. Further, each P+ small block 621 is formed like an isolate island and physically connected to no blocks.

Figure 8:
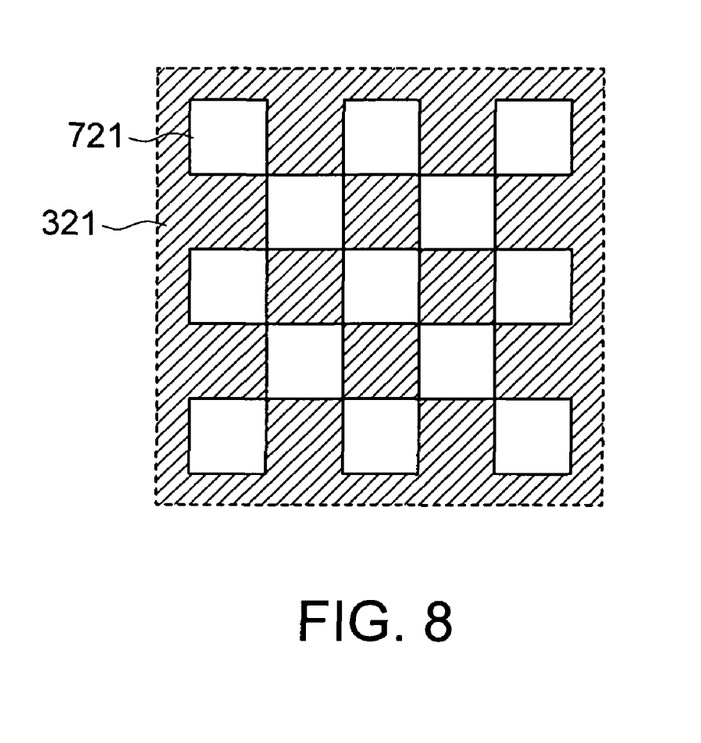
FIG. 8 schematically shows a top view of another semiconductor device for electrostatic discharge (ESD) protection according to the second embodiment of the present invention.

FIG. 8 schematically shows a top view of another semiconductor device for electrostatic discharge (ESD) protection according to the second embodiment of the present invention. As shown in FIG. 8, the diode comprises P+ small blocks 721 (i.e. formed within the second well 321) with substantially square cross-sections, and the P+ small blocks 721 are arranged to form a plurality of columns in parallel. Also, the P+ small blocks 721 of each column are apart from each other, and the P+ small blocks 721 of adjacent columns are apart from each other. Furthermore, the small blocks of each column are staggered to the blocks of adjacent column, and the P+ small block 721 can be connected to the other block(s) through the corner(s). As shown in FIG. 8, the small blocks are arranged as a tessellated pattern.

Figure 9:
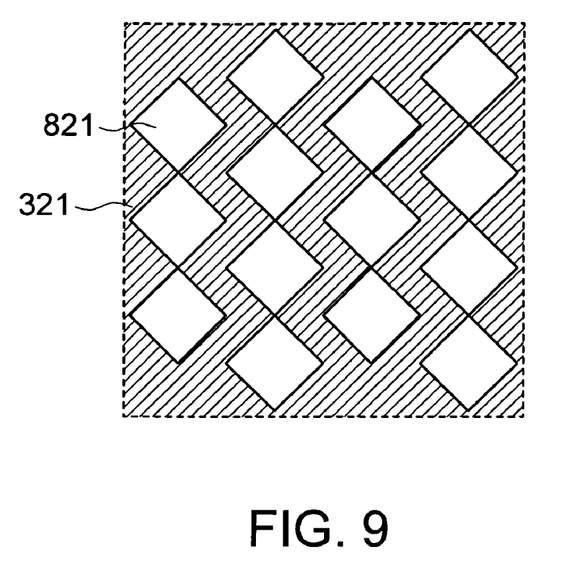
FIG. 9 schematically shows a top view of another semiconductor device for electrostatic discharge (ESD) protection according to the second embodiment of the present invention.

FIG. 9 schematically shows a top view of another semiconductor device for electrostatic discharge (ESD) protection according to the second embodiment of the present invention. As shown in FIG. 9, the diode comprises P+ small blocks 821 (i.e. formed within the second well 321) with substantially rhombic cross-sections, and the P+ small blocks 821 are arranged to form a plurality of columns in parallel. Also, the P+ small blocks 821 of each column are adjoined to each other, and the P+ small blocks 821 of adjacent columns are apart from each other. Furthermore, the P+ small blocks 821 of each column are substantially staggered to the blocks of adjacent column.

Figure 10:
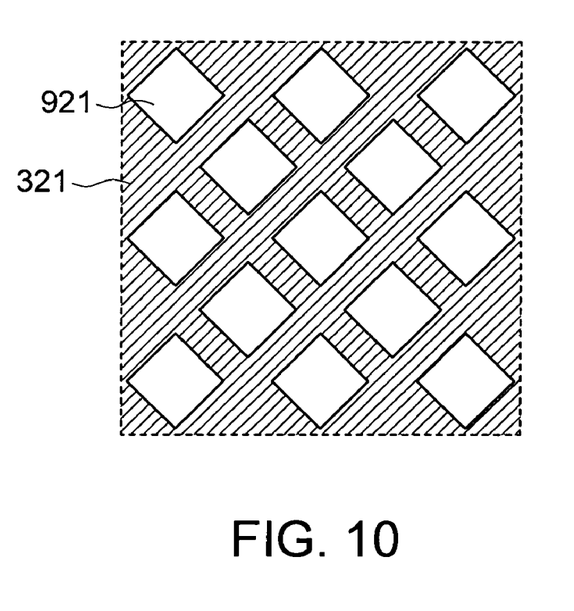
FIG. 10 schematically shows a top view of another semiconductor device for electrostatic discharge (ESD) protection according to the second embodiment of the present invention.

FIG. 10 schematically shows a top view of another semiconductor device for electrostatic discharge (ESD) protection according to the second embodiment of the present invention. As shown in FIG. 10, the diode comprises P+ small blocks 921 (i.e. formed within the second well 321) with substantially rhombic cross-sections, and the P+ small blocks 921 are arranged to form a plurality of columns in parallel. Also, the P+ small blocks 921 of each column are apart from each other, and the P+ small blocks 821 of adjacent columns are apart from each other. Furthermore, the P+ small blocks 921 of each column are substantially staggered to the blocks of adjacent column.

Besides the patterns shown in FIG. 3A, FIG. 5, FIG. 7-FIG. 10, the small blocks of the second embodiment could be arranged as a honeycombed-like pattern, a cellular pattern, or other applicable patterns. Also, the small block could be created to have different shapes of cross-section, for example, rounded cross-section, honeycombed-like cross-section, or other geometric shapes. What the embodiments have disclosed herein are only for the demonstration, not for the limitation.

According to the aforementioned description, the semiconductor device for electrostatic discharge (ESD) protection of the present invention, at least comprising a high-voltage parasite silicon controlled rectifier (HVSCR) and a diode, has a high breakdown voltage and a high holding voltage, so that the device is suitable for being applied on protecting the integrated circuits of electrical equipment that is operated at a high voltage. Additionally, the P+ zone of the diode of the device according to present invention could be preferably constructed as several P+ strips or P+ small blocks within the N-Well, for significantly increasing the number of the junction breakdown edges. The more the junction breakdown edges, the less the resistance of the semiconductor device for ESD protection.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device for electrostatic discharge protection, comprising:
   a high-voltage parasitic silicon controlled rectifier (HVSCR), having an anode and a cathode, the cathode of HVSCR coupled to a ground; and
   a diode, coupled to the HVSCR in series, and the diode having an anode and a cathode, the anode of the diode coupled to the anode of the HVSCR, and the cathode of the diode coupled to a terminal applied with a positive voltage.

2. The device according to claim 1, wherein the HVSCR comprises:
   a plurality of N-type and P-type doping regions, alternatively and contiguously formed within a first N-well.

3. The device according to claim 2, wherein the HVSCR further comprises:
   a P-type doping region disposed between two N-type doping regions, and three said doping regions being spaced from the first well and formed in a P-substrate, and said P-type doping region coupled to the ground.

4. The device according to claim 3, wherein the diode comprises a P-type zone and a N-type doping region formed within a second N-well.

5. The device according to claim 4, wherein the P-type zone of the diode is coupled to one of the N-type doping regions within the first well of the HVSCR.

6. The device according to claim 4, wherein a N-type doping region is formed within the second N-well, and spaced apart from the P-type zone.

7. The device according to claim 6, wherein the N-type doping region formed within the second N-well is connected to the terminal applied with the positive voltage.

8. The device according to claim 4, wherein the P-type zone comprises a plurality of P-type strips spaced apart from each other, and the P-type strips are coupled together to one of the N-type doping regions in the first N-well.

9. The device according to claim 4, wherein the P-type zone of the diode comprises a plurality of P-type small blocks spaced apart from each other, and the P-type small blocks are coupled together to one of the N-type doping regions in the first N-well.

10. The device according to claim 9, wherein each of the P-type small blocks has a rectangular cross-section.

11. The device according to claim 9, wherein each of the P-type small blocks has a rhombic cross-section.

12. The device according to claim 9, wherein each of the P-type small blocks has a rounded cross-section.

13. The device according to claim 9, wherein the P-type small blocks are arranged as a matrix.

14. The device according to claim 9, wherein the P-type small blocks are arranged as a tessellated pattern.

15. The device according to claim 9, wherein the P-type small blocks are arranged as a honeycombed-like pattern.

16. The device according to claim 9, wherein the P-type small blocks are distributed as a cellular pattern.

17. The device according to claim 9, wherein the P-type small blocks are arranged to form a plurality of columns in parallel.

18. The device according to claim 17, wherein the P-type small blocks of each column are staggered to the blocks of adjacent column.

19. The device according to claim 17, wherein the P-type small blocks of each column are adjoined to each other.

20. The device according to claim 17, wherein the P-type small blocks of each column are apart from each other.

21. The device according to claim 2, wherein the P-type doping regions within the first N-well of SCR are coupled to each other.

22. The device according to claim 3, wherein the N-type doping regions of SCR outside the first N-well are coupled to each other.

* * * * *